United States Patent
Kull et al.

(10) Patent No.: US 9,300,312 B2
(45) Date of Patent: Mar. 29, 2016

(54) ANALOG-DIGITAL CONVERTER

(71) Applicant: INTERNATIONAL BUSINESS MACHINES CORPORATION, Armonk, NY (US)

(72) Inventors: Lukas Kull, Thalwi (CH); Thomas H. Toifl, Gattikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/749,352

(22) Filed: Jun. 24, 2015

(65) Prior Publication Data

US 2015/0295586 A1      Oct. 15, 2015

Related U.S. Application Data

(63) Continuation of application No. 14/625,016, filed on Feb. 18, 2015, now Pat. No. 9,191,018.

(30) Foreign Application Priority Data

Feb. 21, 2014   (GB) .................................. 1403082.9

(51) Int. Cl.
   *H03M 1/10*   (2006.01)
   *H03M 1/00*   (2006.01)
   (Continued)

(52) U.S. Cl.
   CPC ............ *H03M 1/1009* (2013.01); *H03M 1/002* (2013.01); *H03M 1/10* (2013.01); *H03M 1/1245* (2013.01); *H03M 1/442* (2013.01)

(58) Field of Classification Search
   CPC .... H03M 1/1009; H03M 1/442; H03M 1/002
   USPC .......................................... 341/120, 155, 161
   See application file for complete search history.

(56) References Cited

U.S. PATENT DOCUMENTS

| | | |
|---|---|---|
| 6,215,428 B1 | 4/2001 | Fossum |
| 7,280,063 B2 | 10/2007 | Ozalevli et al. |

(Continued)

FOREIGN PATENT DOCUMENTS

JP       2013526179 A      6/2013

OTHER PUBLICATIONS

Kerzérho, V. et al., "Fast Digital Post-Processing Technique for Integral Nonlinearity Correction of Analog-to-Digital Converters: Validation on a 12-Bit Folding-and-Interpolating Analog-to-Digital Converter," IEEE Transactions on Instrumentation and Measurement, vol. 60, No. 3, Mar. 3, 2011. (8 Pages).

(Continued)

*Primary Examiner* — Brian Young
(74) *Attorney, Agent, or Firm* — Tutunjian & Bitetto, P.C.; Keivan Razavi

(57) ABSTRACT

An analog-digital converter with successive approximation includes a capacitor array for being loaded by applying a given input signal potential and for providing a sampling potential, wherein capacitors of the capacitor array are serially coupled with switches. A decision latch is included for evaluating the sampling potential in a number of consecutive decision steps. The analog-digital converter also includes a logic unit for selectively changing the sampling potential by selectively switching switches associated to the capacitors of the capacitor array for each decision step based on an evaluation result of a previous decision step, wherein the switches are respectively coupled with a calibration switch.

14 Claims, 3 Drawing Sheets

(51) Int. Cl.
*H03M 1/12* (2006.01)
*H03M 1/44* (2006.01)

(56) References Cited

U.S. PATENT DOCUMENTS

| | | | |
|---|---|---|---|
| 7,928,871 B2 | 4/2011 | Aruga et al. | |
| 7,944,379 B2 | 5/2011 | Ohnhaeuser et al. | |
| 8,223,044 B2 | 7/2012 | Snedeker | |
| 8,451,151 B2* | 5/2013 | Lin | 341/110 |
| 8,487,794 B2* | 7/2013 | Huang et al. | 341/120 |
| 8,508,400 B2 | 8/2013 | Wu et al. | |
| 8,674,862 B1* | 3/2014 | Li et al. | 341/120 |
| 8,981,973 B2* | 3/2015 | Kumar | 341/118 |

OTHER PUBLICATIONS

Moon, U. et al., "Switched Capacitor DAC with Analogue Mismatch Correction," Electronics Letters, vol. 35, No. 22, Oct. 28, 1999. (pp. 1903-1904).

* cited by examiner

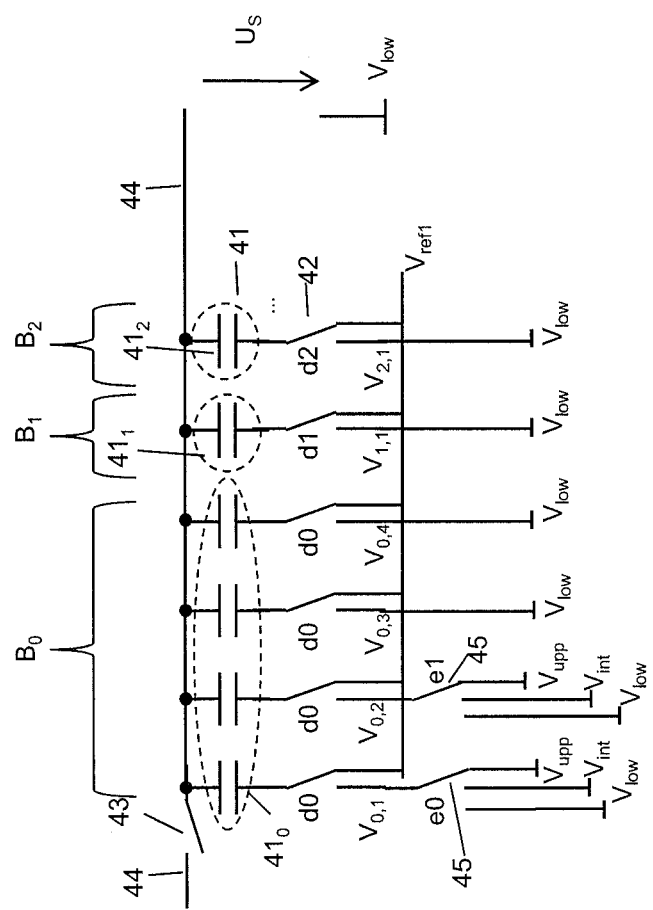

ANALOG-DIGITAL CONVERTER

RELATED APPLICATION DATA

This application is a Continuation application of co-pending U.S. patent application Ser. No. 14/625,016 filed on Feb. 18, 2015, which claims priority under 35 U.S.C. §119 from United Kingdom Patent Application No. 1403082.9 filed Feb. 21, 2014, both of which are incorporated herein by reference in their entirety.

BACKGROUND

1. Technical Field

The present invention relates to analog-digital converters, in particular to successive approximation register (SAR) analog-digital converters (ADCs) and measures to increase the accuracy thereof while maintaining conversion speed and power consumption.

2. Description of the Related Art

SAR converters for analog-digital conversion are well known in the art. In particular, SAR converters are frequently used in integrated CMOS devices since they provide a reasonable resolution and conversion time and can be implemented by optimally utilizing the advantages of the CMOS technology, which are small-sized switches and capacitors having relatively well-defined relative capacitances.

Although SAR ADCs can be implemented in different topologies, they generally include at least one capacitor array. The capacitor array may include a unit capacitor array with stages of identical capacitances and one stage with a doubled capacitance, or a capacitance ladder network comprising stages with capacitance values in a mutual relation of a factor of $2^n$ (n=number of stages).

The capacitors, of the capacitor, array may be charged by connecting to a signal line carrying an input signal potential to be converted. The capacitor array is connected to a latch/comparator which serves for comparing a potential, stored in the capacitor array, to a reference potential in a sampling phase. The comparison result is stored in a shift register. Based on the comparison result of the previous comparing phase, a switching of a capacitance of the capacitor array is performed to increase or decrease the potential stored in the capacitor array before a next comparison is performed. This is repeated until all stages of the capacitor array have been processed.

SAR ADCs generally rely on a capacitor array, including integrated capacitors having well-defined relative capacitances. However, the capacitances of the integrated capacitor array are prone to have a remaining relative mismatch due to the commonly used CMOS technology, e.g., due to lithography, which might result in a higher integral and differential nonlinearity. The matching accuracy of the capacitors strongly depends on their size, such that the higher the areas of the matched capacitors the lower the matching error. In general, the matching error of the capacitors is determined to be no less than an ADC resolution error. Implementing the capacitor array with an intrinsic matching of the capacitors (determined by the area use of the capacitors) beyond the required resolution is, therefore, inefficient with respect to area and power consumption.

Document U.S. Pat. No. 8,223,044 B2 discloses an SAR ADC in which correction capacitors are provided to correct an integral nonlinearity error. The correction capacitors are coupled with a certain comparator depending on stored integral nonlinearity error information, wherein the correction capacitors are selectively coupled to either a ground voltage or a reference voltage.

Document U.S. Pat. No. 7,944,379 B2 discloses an apparatus for analog-to-digital conversion using successive approximation, wherein an integral nonlinearity compensator is configured to provide an integral nonlinearity compensation signal for reducing the integral nonlinearity of the analog-to-digital conversion in response to the digital code representing a conversion result.

Document U.S. Pat. No. 7,280,063 B2 discloses an SAR digital-to-analog converter with an operational amplifier and a plurality of ladder elements of a ladder network. Each ladder element includes a tunable voltage source for providing a voltage, a capacitor, and a switch for selecting a first voltage or a reference voltage and for providing the first selected voltage to the first capacitor. The output of the ladder elements is coupled to the inverting input of the operational amplifier. The reference voltages can be programmed to minimize a mismatch between the capacitors.

Document V. Kerzérho et al., "Fast Digital Post-Processing Technique for Integral Nonlinearity Correction of Analog-to-Digital Converters: Validation on a 12-Bit Folding-and-Interpolating Analog-to-Digital Converter", IEEE Transactions on Instrumentation and Measurement, Vol. 60, Issue 3, March 2011, discloses an SAR ADC converter using a look-up table for the online correction of integral nonlinearity.

Furthermore, document U. Moon et al., "A Switched Capacitor DAC with Analog Mismatch Correction", Electronics Letters, Vol. 35, Issue 22, Oct. 28, 1999, discloses a calibration method for enhancing the accuracy and linearity of a switched-capacitor digital-to-analog converter.

SUMMARY

According to an embodiment of a first aspect of the invention, an analog-digital converter with successive approximation is provided, comprising:

a capacitor array adapted for being loaded by applying a given input signal potential and for providing a sampling potential, wherein capacitors of the capacitor array are serially coupled with switches;

at least one decision latch adapted for evaluating the sampling potential in a number of consecutive decision steps; and a logic unit adapted for selectively changing the sampling potential by selectively switching switches associated with capacitors of the capacitor array for each decision step based on an evaluation result of a previous decision step; wherein at least one of the switches is respectively coupled with a calibration switch.

It is one idea of the above embodied analog-digital converter to tune the actual size of the capacitor in a capacitor ladder network. The tuning may be performed by changing a reference voltage to which a terminal of the capacitors can be switched. Hence, it is provided that some unit capacitors, within the capacitor ladder network, have a configurable reference voltage which can be changed, so that the number of charge switch changes mimics or equals the effect of different capacitor sizes of the respective capacitors. Consequently, the integral and differential linearity can be improved, which may result in a better efficiency of the SAR ADC. Particularly, and compared to conventional approaches, no additional power consumption or speed penalty is to be expected.

Moreover, the switches may be configured to selectively connect the capacitors with one of a first reference potential for loading the given input signal potential and with a second reference potential depending on the evaluation result.

It may further be provided that the capacitors of the capacitor array are partitioned in capacitor groups related to a resolution bit of the analog-digital converter, wherein at least a part of the switches associated to the capacitors of the capacitor array of at least one of the capacitor groups is coupled with a respective calibration switch.

Furthermore, each calibration switch may be configured to set the second reference potential to one of at least an upper reference potential and a lower reference potential, depending on the calibration setting.

According to an embodiment, each calibration switch may be configured to set the second reference potential to one of at least an upper reference potential, one or more intermediate reference potential between the upper and the lower reference potential, and a lower reference potential, depending on the calibration setting.

At least a further part of the capacitors of the capacitor groups of the capacitor array may be coupled with a lower reference potential as the second reference potential in a hardwired manner.

Moreover, a part of the capacitors of the capacitor group of the capacitor array which is related to the most significant bit may be coupled with a calibration switch, and the further part of the capacitors of the capacitor groups of the capacitor array which is related to the most significant bit may be coupled with a lower reference potential in a hardwired manner.

In particular, the part of the capacitors of the capacitor group of the capacitor array which is related to the most significant bit may comprise two or more capacitors, and the further part of the capacitors of the capacitor group of the capacitor array which is related to the most significant bit may comprise one or more capacitors.

Furthermore, the capacitor array has a unit capacitor array topology or a topology corresponding to a capacitance ladder.

It may be provided that the capacitor array is directly coupled with the at least one decision latch.

According to an embodiment of a further aspect, a method for calibrating the above analog-digital converter with successive approximation is provided, wherein the calibration switches are preset by a given calibration setting.

In general, where features are described herein with reference to an embodiment of one aspect of the invention, corresponding features may be provided in embodiments of the other aspect of the invention.

BRIEF DESCRIPTION OF THE DRAWINGS

Preferred embodiments of the present invention are described, by way of example only, with reference to the accompanying drawings, in which:

FIG. 3 shows a further example of a capacitor array used in the analog-digital converter of FIG. 1.

In general, where features are described herein with reference to an embodiment of one aspect of the invention, corresponding features may be provided in embodiments of the other aspect of the invention.

DETAILED DESCRIPTION OF THE EMBODIMENTS

Figure 1:
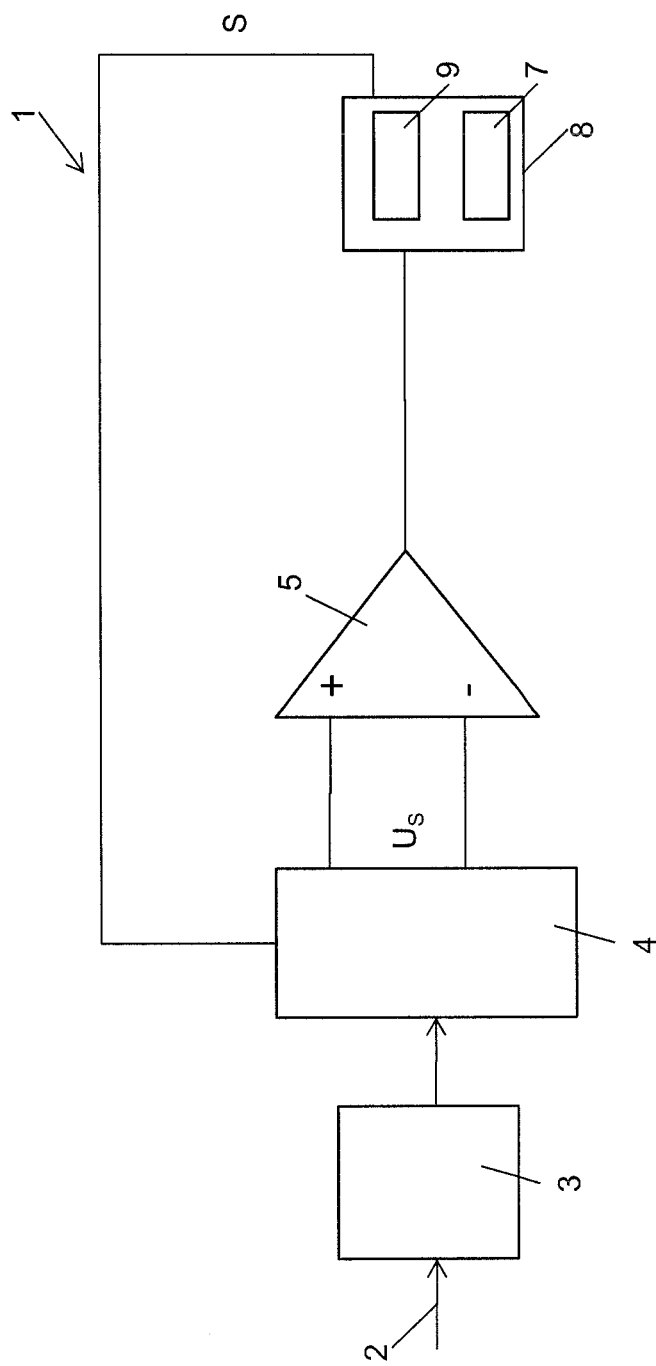
FIG. 1 shows a schematic of the basic architecture of a successive approximation register analog-digital converter according to an embodiment.

FIG. 1 schematically shows a block diagram of a successive approximation register analog-digital converter SAR ADC 1. For reasons of simplicity, a unipolar non-differential SAR ADC is described while the principle of the invention can also be applied to differential SAR ADCs. An input signal received at the input line 2 is fed to a track-and-hold unit 3, which conserves the voltage value of the input signal at a specific point in time and supplies the hold input signal voltage to a capacitor array 4 (capacitor bank) via an input signal line 44. The hold input signal voltage/potential is used to precharge capacitors 41 of the capacitor array 4. Each capacitor 41 is charged in response to the supplied input signal voltage/potential.

The capacitor array 4 may be implemented in a unit capacitor array topology, or in a topology where the capacitances between the stages of the capacitor array 4 differ by a factor of $2^n$ (n=1 ... n, n=number of stages). In further embodiments, the basis of this factor can also be smaller than 2 if redundancy is provided. Although there are many implementations, the basic principle remains the same.

Figure 2:
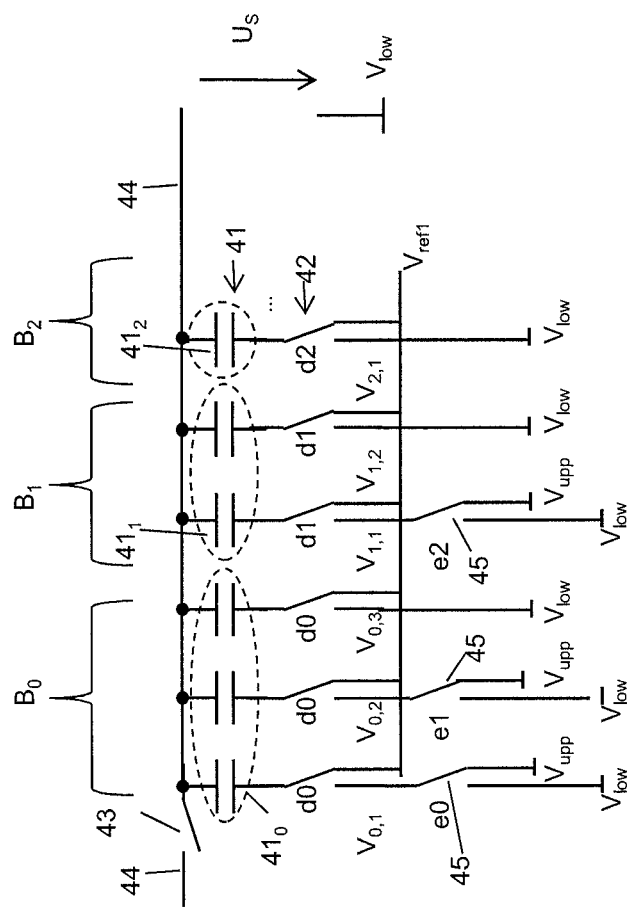
FIG. 2 shows an example of a capacitor array used in the analog-digital converter of FIG. 1.

As shown by way of example for the capacitor array 4 in more detail in FIG. 2, the capacitor array 4 may be implemented as a unit capacitor array with a number of capacitors 41 (each with a capacitance C) switched by switches 42. The switches 42 are serially connected and associated to the respective capacitors 41. First terminals of the capacitors 41 are commonly connected to the input signal line 44 providing the input signal voltage/potential held by the track-and-hold unit 3. Second terminals of the capacitors 41 are connected to the respective switches 42. Each bit $B_0$, $B_1$, $B_2$ ... related to the ADC resolution is associated to one or more capacitors 41 of respective capacitor groups $41_0$, $41_1$, $41_2$. The capacitors 41 associated to the most significant bit $B_0$ are referenced as capacitor group $41_0$, the capacitors 41 associated to the second most significant bit $B_1$ are referenced as capacitor group $41_1$, etc.

The switches 42 are capable of being switched by a respective control signal d0, d1, d2 ... to at least two states, i.e., a first switching state for connecting the second terminal of the respective capacitor 41 to a first reference potential $V_{ref1}$, which is preferably common for all capacitors 41, and to a second switching state for connecting the second terminal of the respective capacitor 41 to a respective second reference potential $V_{0,1}$, $V_{0,2}$, $V_{0,3}$, $V_{1,1}$, $V_{1,2}$, $V_{2,1}$, ..., which tends to be equal to or lower than the first reference potential $V_{ref1}$ and which can, at least partly, be selectively preset. The second reference potential $V_{0,1}$, $V_{0,2}$, $V_{0,3}$, $V_{1,1}$, $V_{1,2}$, $V_{2,1}$ is initially set to a lower reference potential $V_{low}$ which is lower than an upper reference potential $V_{upp}$ which usually (but not necessarily) corresponds to the first reference potential $V_{ref1}$ against which the capacitors 41 are charged. The conversion range of the SAR ADC 1 is defined by the voltage span between the lower reference potential $V_{low}$ and the first reference potential $V_{ref1}$.

In the present embodiment, the number of capacitors 41 of the capacitor group $41_0$ of the stage of the capacitor array 4 representing the most significant bit $B_0$ is set to 3. In a common unit capacitor array, two capacitors 41 may be provided in an integrated configuration to provide a capacitance of 2 C. However, the capacitors 41 of the capacitor group $41_0$ associated to the most significant bit $B_0$ can substantially be any number of capacitors 41, forming a total capacitance of more than 2 C. Switches 42 for each capacitor 41 associated with the same bit $B_0$, $B_1$, $B_2$ are controlled by the same respective control signal d0, d1, d2, respectively. Hence, switches 42 for each capacitor $41_0$ associated to the most significant bit $B_0$ are, e.g., controlled by the control signal d0.

In an initial state all switches 42 are in a state where the second terminals of the capacitors 41 are connected to the first reference potential $V_{ref1}$. By closing a precharging switch 43, the hold input signal voltage (potential) is applied to the input signal line 44, thereby precharging the parallel-connected capacitors 41 with respect to the first reference potential $V_{ref1}$. The first terminals of the capacitors 41 are connected to the track-and-hold unit 3 to receive the hold input signal potential, so that the capacitance formed by all capacitors 41 can be precharged with the hold input signal voltage/potential. After precharging is completed, the precharging switch 43 is opened, so that a corresponding charge remains stored in the capacitors 41.

The capacitor array 4 provides to the input signal line 44 the sampling voltage $U_S$, which corresponds to the supplied input signal voltage/potential before any switching is performed. The sampling voltage $U_S$ is applied to a decision latch 5. Preferably, the sampling voltage $U_S$ is directly coupled with a non-inverting input of the decision latch 5, i.e., without using passive components and/or additional switches, while the inverting input of the decision latch 5 is coupled with a given comparison potential, which preferably corresponds to a lower reference potential $V_{low}$, e.g., a ground potential. The decision latch 5 may correspond to conventional operational amplifiers and be operable to evaluate the sampling voltage $U_S$ at its input, and to provide a digital decision result indicating whether the sampling voltage $U_S$ is above or below the given comparison potential. The decision latch 5 may need to be reset prior to each evaluation.

After each decision performed by the decision latch 5, the one or more switches 42 associated to the capacitors 41 of the stage of the capacitor array 4 related to the next less significant bit is set (switched or not switched) to keep it connected to the first reference potential $V_{ref1}$ or to connect it to the second reference potential $V_{0,1}, V_{0,2}, V_{0,3}, V_{1,1}, V_{1,2}, V_{2,1}$. As a result, the sampling voltage $U_S$ changes or remains the same, and will be supplied to the decision latch 5 for the next comparison step. For providing the sampling voltage $U_S$ for each decision, the switching state of the switches 42 is thus consecutively determined and set, such that the voltage stored in the capacitors 41 is changed (or not) to obtain the respective sampling voltage $U_S$.

The decision results obtained by the decision latch 5 are collected and stored in a memory, such as a shift register 7 of a logic block 8, in which the control signals d0, d1, d2 . . . are generated or merely provided corresponding to the entries in the shift register 7. The logic block 8 further includes a logic unit 9, which may process the decision results stored in the shift register 7 in order to obtain control signals d0, d1, d2 . . . indicating the switching states of the switches 42 of the capacitor array 4.

Particularly, starting with the control signal d0 for switching the capacitors 41 of the capacitor group $41_0$ associated to the most significant bit $B_0$, a switching of the capacitors $41_0$ associated to the most significant bit $B_0$ is effected by a control signal d0. A control signal d0 for switching is generated if there is a positive decision result obtained in the decision latch 5. Next, due to the corresponding switching of the switches 42 associated to the most significant bit $B_0$, the sampling voltage $U_S$ is reduced.

The resulting sampling voltage $U_S$ is applied to the non-inverting input of the decision latch 5. A positive decision result then results in a respective control signal d1, effecting a switching of the capacitors 41 related to the second most significant bit $B_1$, while a negative decision result would leave the respective switches 42 associated to the capacitors 41 of the second most significant bit $B_1$ unchanged. This procedure is repeated until a switching (or a non-switching) of the capacitor(s) 41 for the least significant bit has been determined. In a capacitor array for a differential ADC, however, the decision result determines at which side of the capacitor array a switching associated to a capacitor has to be carried out.

As further shown in FIG. 2, some of the second reference potentials $V_{0,1}, V_{0,2}, V_{0,3}, V_{1,1}, V_{1,2}, V_{2,1}$ can be individually selected by means of calibration switches 45, depending on a calibration setting e0, e1, e2. The calibration setting e0, e1, e2 may be stored in, and retrieved from, a calibration register 10. In the shown embodiment, the calibration switches 45 are configured to select as the second reference potential $V_{0,1}, V_{0,2}, V_{1,1}$, a potential between the upper reference potential $V_{upp}$ (which usually corresponds to the first reference potential $V_{ref1}$) and the lower reference potentials $V_{low}$ for the switches 42 associated to two respective capacitors 41 of capacitor group $41_0$ of the most significant bit $B_0$, and for one switch 42 associated to a respective capacitor 41 of the capacitor group $41_1$ of the second most significant bit $B_1$.

In one embodiment, the calibration switches 45 are binary switches which selectively apply the upper reference potential $V_{upp}$ and the lower reference potential $V_{low}$ as the second reference potential $V_{0,1}, V_{0,2}, V_{1,1}$. In further embodiments, the calibration switches 45 can be configured to be switchable to multiple states to selectively apply as the second reference potential $V_{0,1}, V_{0,2}, V_{1,1}$, respective auxiliary reference potentials which are in a range between the upper reference potential $V_{upp}$ and the lower reference potential $V_{low}$.

In contrast to conventional SAR ADCs, the second reference potentials $V_{0,1}, V_{0,2}, V_{0,3}, V_{1,1}, V_{1,2}, V_{2,1}$ . . . are either set predeterminedly in a hardwired configuration, or by means of calibrations switches which are controlled by the calibration settings e0, e1, e2.

In a calibration process, the respective potential to be selected as at least a part of the second reference potentials $V_{0,1}, V_{0,2}, V_{0,3}, V_{1,1}, V_{1,2}, V_{2,1}$ can be set such that the integral and/or differential linearity error can be optimally reduced. To provide a calibration, the second reference potential $V_{0,1}, V_{0,2}, V_{0,3}, V_{1,1}, V_{1,2}, V_{2,1}$ associated to some of the capacitors 41, particularly to some of the capacitors 410 associated to the most significant bit $B_0$, can be selectively applied by a calibration setting e0, e1, e2 stored in the calibration register 10 which determines, from a number of provided auxiliary reference potentials, which of the auxiliary reference potentials is applied as the second reference potential $V_{0,1}, V_{0,2}, V_{0,3}, V_{1,1}, V_{1,2}, V_{2,1}$, respectively.

Furthermore, as shown in the embodiment of FIG. 3, the number of capacitors 41 of the capacitor group $41_0$ associated to the most significant bit $B_0$ is 4, wherein for two of the capacitors 41, the second reference potential $V_{0,3}, V_{0,4}$ is set in a hardwired manner to the lower reference potential $V_{low}$, and for the other two of the capacitors 41, the second reference potential $V_{0,1}, V_{0,2}$ can be selectively calibrated. The respective calibration switches 45 can be preset to three states for selecting one of the lower reference potential $V_{low}$, the upper reference potential $V_{upp}$, or an intermediate reference potential $V_{int}$ corresponding to the halfway potential between the lower reference potential $V_{low}$ and the upper reference potential $V_{int}=(V_{upp}-V_{low})/2$.

Hence, the calibration switches 45 can be used to tweak the total capacitance of four capacitors 41 of the capacitor group $41_0$ associated to the most significant bit $B_0$ of the analog-digital converter 1, switched by the first control signal d0 to any of the capacitances 2 C, 2.5 C, 3 C, 3.5 C or 4 C. This allows for a careful calibration of the capacitance of the ladder network related to the most significant bit $B_0$. Additional intermediate calibration voltages can be used to refine the tweaking of capacitances.

The invention claimed is:

1. An analog-digital converter with successive approximation, comprising:
   a capacitor array configured to be loaded by applying a given input signal potential and configured to provide a sampling potential, wherein capacitors of the capacitor array are serially coupled with switches and the capacitors of the capacitor array are partitioned into capacitor groups;
   at least one decision latch configured to evaluate the sampling potential in a number of consecutive decision steps; and
   a logic unit configured to selectively change the sampling potential by selectively switching switches associated to capacitors of the capacitor array for each decision step based on an evaluation result of a previous decision step;
   wherein at least one of the switches is coupled with at least one calibration switch.

2. The analog-digital converter according to claim 1, wherein the switches are configured to selectively connect the capacitors to a first reference potential for loading the given input signal potential and to a second reference potential depending on the evaluation result.

3. The analog-digital converter according to claim 2, wherein the capacitor groups relate to a resolution bit of the analog-digital converter, and wherein at least a part of the switches associated to the capacitors of the capacitor array of at least one of the capacitor groups is coupled with a respective one of the at least one calibration switch.

4. The analog-digital converter according to claim 3, wherein each of the at least one calibration switch is configured to set the second reference potential as one of at least a given upper reference potential and a given lower reference potential depending on a calibration setting.

5. The analog-digital converter according to claim 3, wherein each of the at least one calibration switch is configured to set the second reference potential as one of at least an upper reference potential, one or more intermediate reference potentials, and a lower reference potential, depending on the calibration setting, wherein the intermediate reference potential is between the upper and the lower reference potentials.

6. The analog-digital converter according to claim 3, wherein at least a further part of the capacitors of the capacitor groups of the capacitor array is coupled with a lower reference potential as the second reference potential in a hardwired manner.

7. The analog-digital converter according to claim 3, wherein a part of the capacitors of at least one of the capacitor groups of the capacitor array which is related to a most significant bit is coupled with at least one of the at least one calibration switch, and wherein a further part of the capacitors of the at least one of the capacitor groups of the capacitor array which is related to the most significant bit is coupled to a lower reference potential in a hardwired manner.

8. The analog-digital converter according to claim 7, wherein the part of the capacitors of the at least one of the capacitor groups of the capacitor array which is related to the most significant bit comprises two or more capacitors and wherein the further part of the capacitors of the at least one of the capacitor groups of the capacitor array which is related to the most significant bit comprises one or more capacitors.

9. The analog-digital converter according to claim 1, wherein the capacitor array has a 2CC topology or a topology corresponding to a capacitance ladder.

10. The analog-digital converter according to claim 1, wherein the capacitor array is directly coupled with the at least one decision latch.

11. The analog-digital converter according to claim 1, wherein at least one of the at least one calibration switch is preset by a given calibration setting.

12. The analog-digital converter according to claim 1, wherein switches associated with capacitors of a capacitor group are controlled by a same respective control signal.

13. The analog-digital converter according to claim 2, wherein the second reference potential is less than or equal to the first reference potential.

14. The analog-digital converter according to claim 13, wherein the sampling potential is reduced when the switches connect the capacitors of the capacitor array to the second reference potential.

* * * * *